(12) United States Patent
Saeki

(10) Patent No.: US 11,978,749 B2
(45) Date of Patent: May 7, 2024

(54) SOLID-STATE IMAGE SENSOR, IMAGE SCANNING DEVICE, AND IMAGE FORMING APPARATUS

(71) Applicant: Masayuki Saeki, Osaka (JP)

(72) Inventor: Masayuki Saeki, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 354 days.

(21) Appl. No.: 17/203,997

(22) Filed: Mar. 17, 2021

(65) Prior Publication Data

US 2021/0296385 A1   Sep. 23, 2021

(30) Foreign Application Priority Data

Mar. 19, 2020   (JP) ................ 2020-049599

(51) Int. Cl.
| | | |
|---|---|---|
| H01L 27/146 | (2006.01) | |
| G02B 5/20 | (2006.01) | |
| H04N 1/024 | (2006.01) | |
| H04N 1/60 | (2006.01) | |
| H04N 25/11 | (2023.01) | |

(52) U.S. Cl.
CPC ........ H01L 27/14621 (2013.01); G02B 5/201 (2013.01); H01L 27/14605 (2013.01); H01L 27/14607 (2013.01); H01L 27/14627 (2013.01); H01L 27/14643 (2013.01); H04N 1/024 (2013.01); H04N 1/6058 (2013.01); H04N 25/11 (2023.01)

(58) Field of Classification Search
CPC ......... H01L 27/14621; H01L 27/14627; H01L 27/14643; H01L 27/14605; H01L 27/14607; G02B 5/201; H04N 1/024; H04N 25/11; H04N 1/486
See application file for complete search history.

(56) References Cited

U.S. PATENT DOCUMENTS

| | | | |
|---|---|---|---|
| 5,592,223 A | 1/1997 | Takamura et al. | |
| 10,186,537 B2 | 1/2019 | Suzuki | |
| 2009/0128672 A1 | 5/2009 | Watanabe | |
| 2014/0199801 A1* | 7/2014 | Kurihara | H01L 27/14685 438/70 |

(Continued)

FOREIGN PATENT DOCUMENTS

| | | |
|---|---|---|
| JP | S56-089176 | 7/1981 |
| JP | H06-151797 | 5/1994 |

(Continued)

OTHER PUBLICATIONS

Japanese Office Action for 2020-049599 dated Oct. 3, 2023.
Japanese Office Action for JP2020-049599 mailed on Feb. 13, 2024.

*Primary Examiner* — David Vu
*Assistant Examiner* — Brandon C Fox
(74) *Attorney, Agent, or Firm* — IPUSA, PLLC

(57) ABSTRACT

A solid-state image sensor includes a first color filter and a second color filter having different thicknesses and configured to transmit light in predetermined wavelength regions, light-receiving devices configured to receive the light in the predetermined wavelength regions passing through the first color filter and the second color filter, and a light amount compensator configured to compensate for an amount of the light passing through the first color filter or the second color filter.

9 Claims, 14 Drawing Sheets

(56) References Cited

U.S. PATENT DOCUMENTS

| | | | |
|---|---|---|---|
| 2019/0041559 A1 | 2/2019 | Higashitani et al. | |
| 2019/0165021 A1* | 5/2019 | Ono | H01L 27/14645 |
| 2019/0288018 A1* | 9/2019 | Tomekawa | H01L 27/14609 |
| 2019/0297278 A1* | 9/2019 | Sumi | G02B 5/281 |
| 2021/0027035 A1* | 1/2021 | Tan | G02F 1/13318 |

FOREIGN PATENT DOCUMENTS

| | | | | |
|---|---|---|---|---|
| JP | 2006-078766 | | 3/2006 | |
| JP | 2009-88255 | | 4/2009 | |
| JP | 2017-162886 | | 9/2017 | |
| KR | 1020110079276 | * | 7/2011 | ....... H01L 27/14636 |
| KR | 10201100792761 | * | 7/2011 | ....... H01L 27/14636 |
| WO | 2017/138370 | | 8/2017 | |
| WO | 2017/200007 | | 11/2017 | |
| WO | WO-2020070887 A1 | * | 4/2020 | |

* cited by examiner

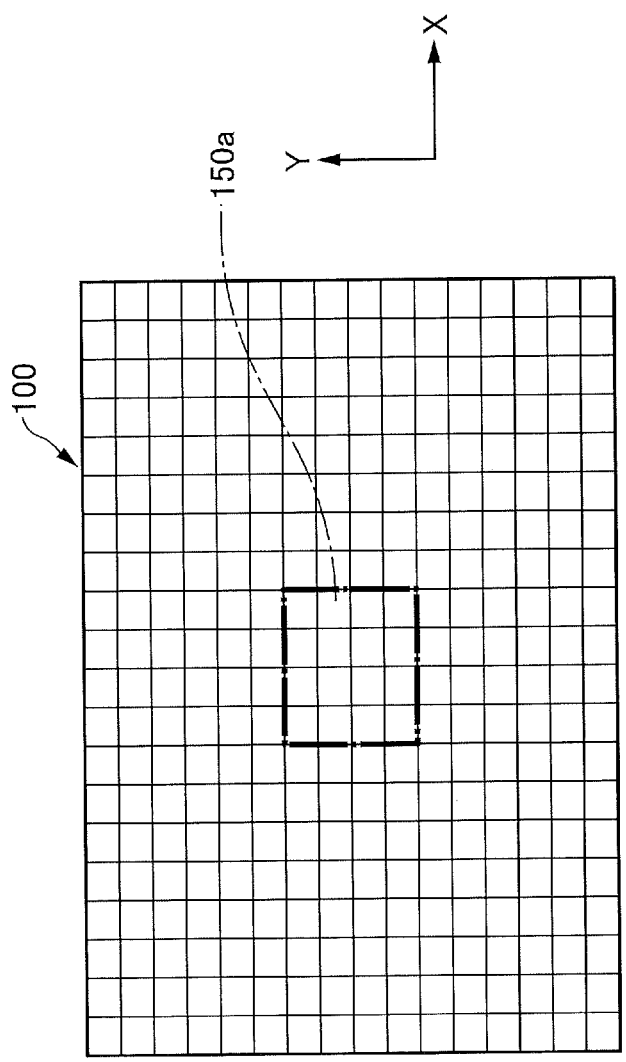
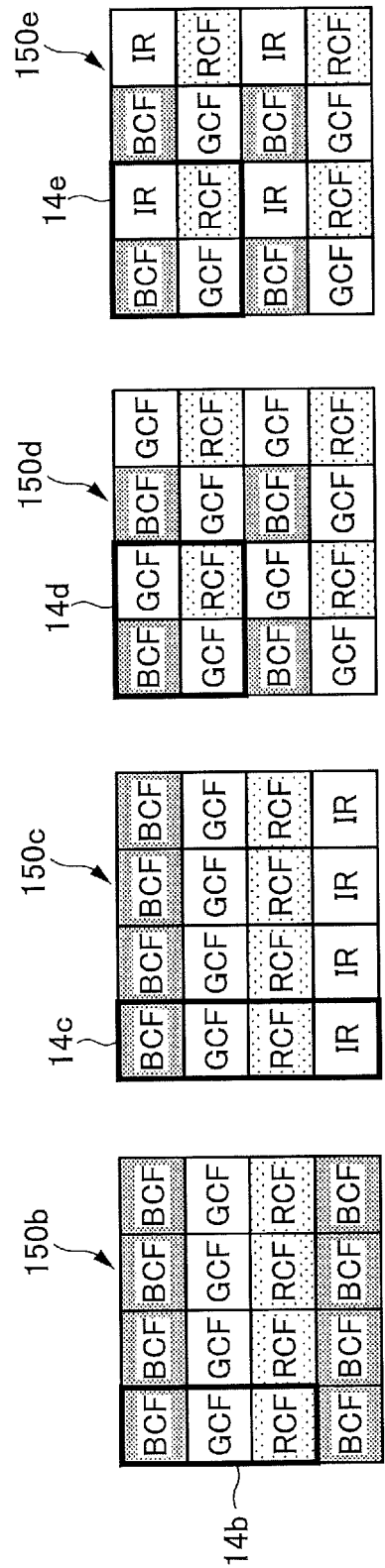

FIG.7
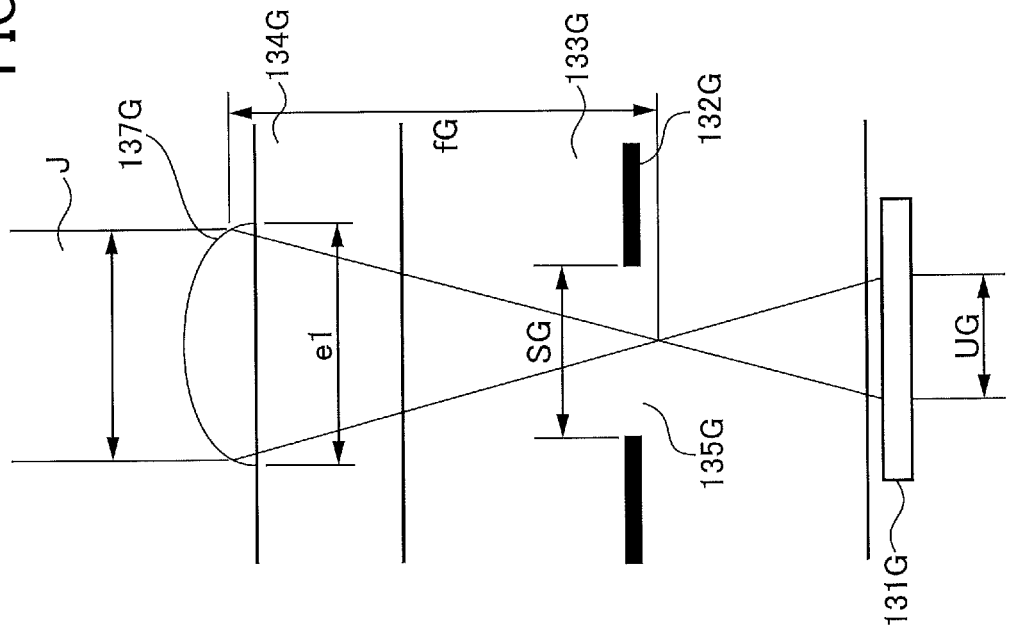
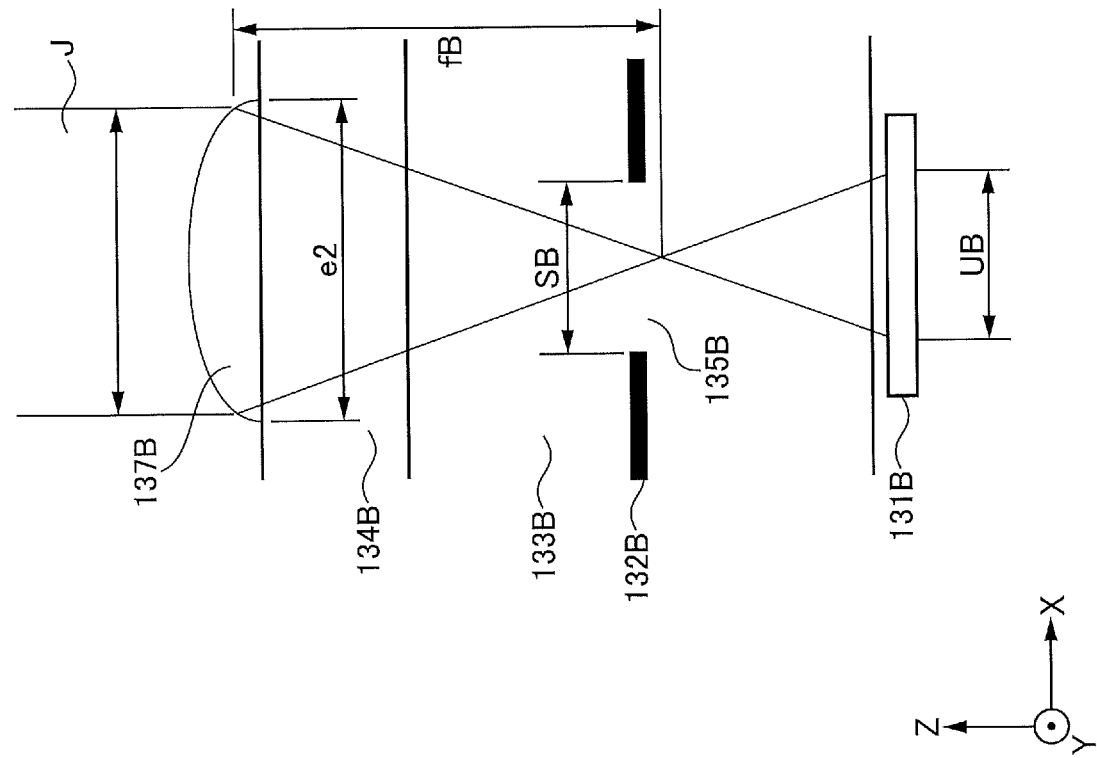

SOLID-STATE IMAGE SENSOR, IMAGE SCANNING DEVICE, AND IMAGE FORMING APPARATUS

CROSS-REFERENCE TO RELATED APPLICATION

The present application claims priority under U.S.C. § 119 to Japanese Patent Application No. 2020-049599, filed on Mar. 19, 2020, the contents of which are incorporated herein by reference in their entirety.

BACKGROUND OF THE INVENTION

1. Field of the Invention

An aspect of this disclosure relates to a solid-state image sensor, an image scanning device, and an image forming apparatus.

2. Description of the Related Art

In a known configuration of a solid-state image sensor such as a charge coupled device (CCD) or a complementary metal oxide semiconductor (CMOS), color filters that transmit specific wavelength components are provided for respective pixels, and a desired color is captured with a combination of multiple pixels.

Also, for example, WO 2017/138370 discloses a configuration including a pixel array where high-sensitivity pixels and low-sensitivity pixels are arranged. The high-sensitivity pixels and the low-sensitivity pixels are configured to have different optical sensitivities without changing their spectral characteristics so that the dynamic range in imaging can be expanded.

However, with the related-art technology, the color reproducibility may be reduced when an unnecessary wavelength component is received through a color filter.

SUMMARY OF THE INVENTION

According to an aspect of this disclosure, there is provided a solid-state image sensor that includes a first color filter and a second color filter having different thicknesses and configured to transmit light in predetermined wavelength regions, light-receiving devices configured to receive the light in the predetermined wavelength regions passing through the first color filter and the second color filter, and a light amount compensator configured to compensate for an amount of the light passing through the first color filter or the second color filter.

BRIEF DESCRIPTION OF THE DRAWINGS

FIGS. 5A through 5E are drawings illustrating examples of arrangements of pixel parts;

FIG. 7 is a drawing illustrating examples of optical paths from microlenses to photodiodes;

DESCRIPTION OF THE EMBODIMENTS

Figure 1A:
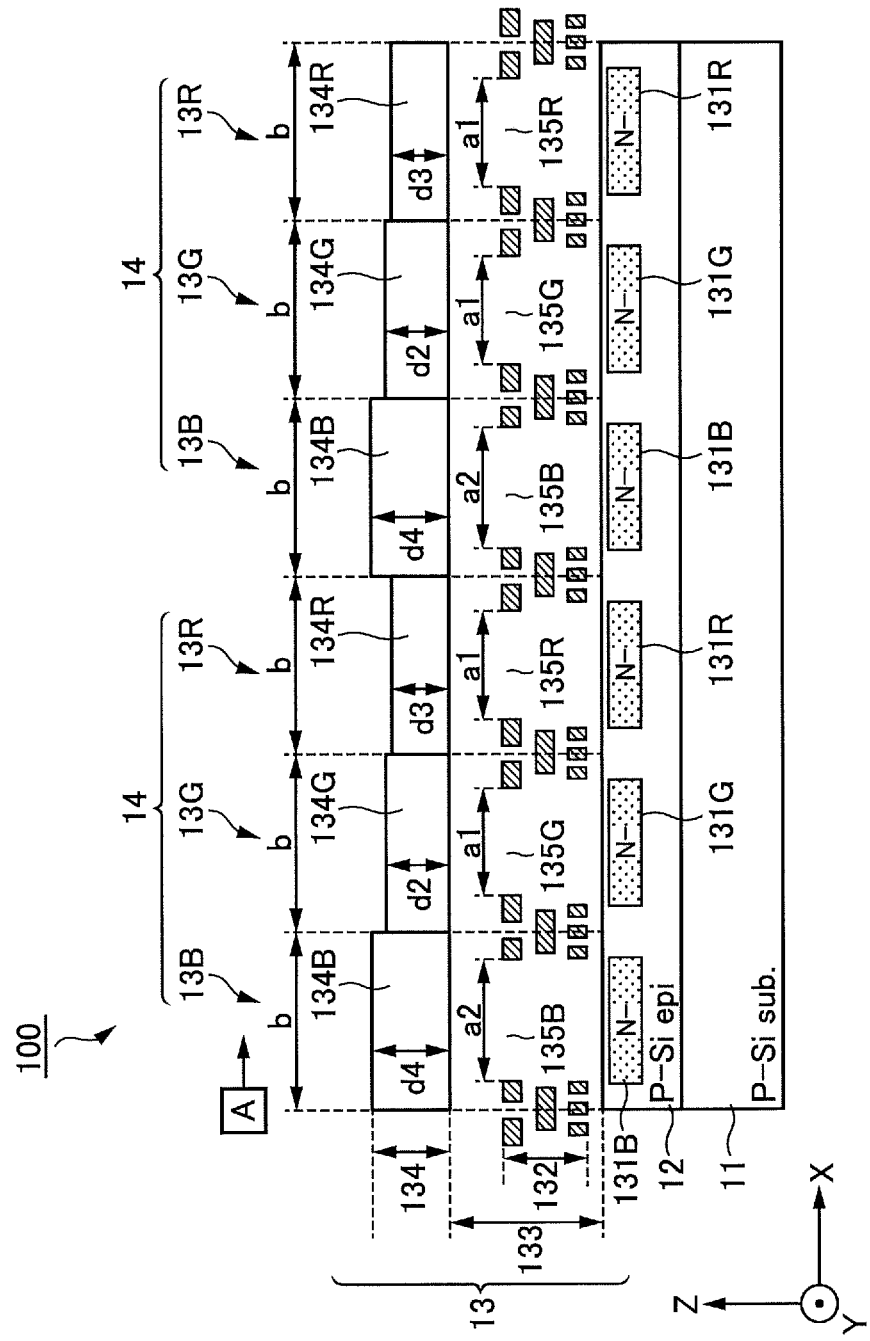
FIG. 1A is a cross-sectional view of a solid-state image sensor according to a first embodiment.

An aspect of this disclosure makes it possible to improve the color reproducibility of a solid-state image sensor.

Embodiments of the present invention are described below with reference to the accompanying drawings. Throughout the drawings, the same reference number is assigned to the same component, and repeated descriptions of the same component may be omitted.

According to an embodiment, first and second color filters that transmit light in predetermined wavelength regions are formed with different thicknesses, and a decrease in the amount of light in one of the predetermined wavelength regions caused by changing the thicknesses of the first and second color filters is compensated for by a light amount compensator. This configuration enables a light-receiving device to receive a desired amount of light in a predetermined wavelength region and thereby makes it possible to improve the color reproducibility of a solid-state image sensor.

More specifically, a solid-state image sensor according to an embodiment includes a first color filter that transmits light in a first wavelength region, a first light receiving device that receives the light in the first wavelength region passing through the first color filter, a first defining part that defines a first light receiving area of the light in the first wavelength region on the first light receiving device, a second color filter that transmits light in a second wavelength region, a second light receiving device that receives the light in the second wavelength region passing through the second color filter, and a second defining part that defines a second light receiving area of the light in the second wavelength region on the second light receiving device.

The first light receiving area is made greater than the second light receiving area. Also, when a maximum transmittance wavelength indicates a wavelength corresponding to a maximum transmittance in a visible light region between 400 nm and 700 nm, the first color filter has a thickness at which an average transmittance of light in a wavelength region less than or equal to "the maximum transmittance wavelength−100 nm" and a wavelength region greater than or equal to "the maximum transmittance wavelength+100 nm" becomes less than or equal to 5% of the maximum transmittance.

Specifying the thickness of the first color filter makes it possible to make the amount of light in wavelength regions other than the first wavelength region and passing through the first color filter sufficiently smaller than the amount of light in the first wavelength region. Also, making the first light receiving area greater than the second light receiving area makes it possible to compensate for a decrease in the amount of the light in the first wavelength region caused by specifying the thickness of the first color filter. This enables the first light receiving device to receive a desired amount of light in the first wavelength region and to improve the color reproducibility of the solid-state image sensor.

The wavelength regions of light that the first and second color filters transmit may be determined within the visible light wavelength region or may be determined by also considering wavelength regions other than the visible light region between 400 nm and 700 nm.

First Embodiment

<Configuration of Solid-State Image Sensor 100>

First, an example of a configuration of a solid-state image sensor 100 according to a first embodiment is described with reference to FIG. 1. FIG. 1A is a cross-sectional view of the solid-state image sensor 100, and FIG. 1B is a plan view of the solid-state image sensor 100 at a position A in FIG. 1A.

Figure 1B:
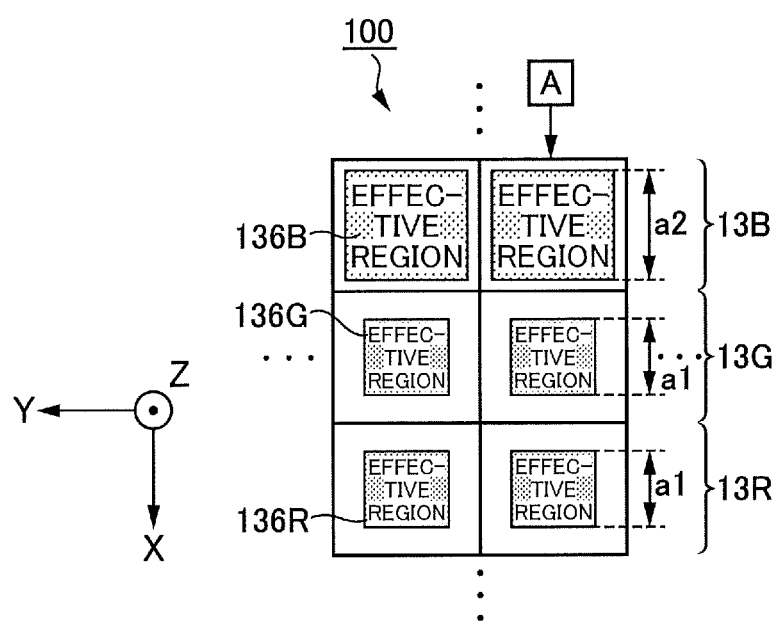
FIG. 1B is a plan view of the solid-state image sensor at a position A in FIG. 1A.

As illustrated in FIGS. 1A and 1B, the solid-state image sensor 100 includes a semiconductor substrate 11, an epitaxial layer 12 that is stacked on the +Z side of the semiconductor substrate 11, and multiple pixel parts 13 formed on the +Z side of the epitaxial layer 12.

The semiconductor substrate 11 and the epitaxial layer 12 are P-type semiconductor regions formed of silicon.

Each of the pixel parts 13 includes a photodiode 131, an interlayer film 133 including a metal wiring part 132, and a color filter layer 134 that are stacked in the Z direction. The pixel parts 13 are arranged two-dimensionally in the XY plane. Any pair of adjacent pixel parts 13 are arranged at a common interval b.

A pixel part 13B of the multiple pixel parts 13 is a pixel that outputs a light detection signal (imaging signal) of light in a wavelength region between 410 nm and 490 nm corresponding to a blue wavelength region. Similarly, a pixel part 13G is a pixel that outputs a light detection signal of light in a wavelength region between 510 nm and 580 nm corresponding to a green wavelength region. A pixel part 13R is a pixel that outputs a light detection signal of light in a wavelength region between 580 nm and 650 nm corresponding to a red wavelength region.

The pixel parts 13R, 13G, and 13B may be referred to as pixel parts 13 when it is not necessary to distinguish them. Also, other components provided for respective colors may be referred to without using suffixes R, G, and B when it is not necessary to distinguish them.

The photodiode 131 is an N-type semiconductor region including silicon and is a light-receiving device having a photoelectric conversion function.

The interlayer film 133 is an insulating film that transmits incident visible light and near-infrared light. However, the metal wiring part 132 formed in the interlayer film 133 does not transmit the incident visible light and near-infrared light.

The interlayer film 133 may be formed of any material that has an insulating property and has transparency to visible light and near-infrared light. In the descriptions below, for brevity, the incident visible light and near-infrared light may be collectively referred to as "incident light".

The metal wiring part 132 in the interlayer film 133 is formed in a grid pattern to span the pixel parts 13 in the XY plane and is used to transmit, for example, control signals and power signals. The metal wiring part 132 may be formed of a metal material such as aluminum or copper. In the solid-state image sensor 100, three layers including the metal wiring part 132 in the XY plane are stacked in the Z direction in the interlayer film 133.

Here, the metal wiring part 132 reflects incident light and does not have transparency to the incident light. Therefore, incident light does not pass through portions of the interlayer film 133 where the metal wiring part 132 is formed, and incident light passes through portions of the interlayer film 133 where the metal wiring part 132 is not formed.

Accordingly, the metal wiring part 132 has a function to define effective regions where incident light can pass through, and the photodiodes 131 receive only parts of incident light on the interlayer film 133. In other words, the metal wiring part 132 functions as apertures 135 that define effective regions where incident light can pass through.

In the solid-state image sensor 100, among the three layers including the metal wiring part 132, the metal wiring part 132 in the farthest layer in the +Z direction functions as the apertures 135. Among the apertures 135 of the pixel parts 13, an aperture 135B included in the pixel part 13B is a square aperture having a side length a2. Each of an aperture 135G included in the pixel part 13G and an aperture 135R included in the pixel part 13R is a square aperture having a side length a1. However, the apertures 135 are not limited to square apertures and may be, for example, rectangular apertures, circular apertures, or elliptical apertures. Here, in the case of a non-axisymmetric aperture such as a rectangular aperture or an elliptical opening, the longer direction (e.g., the direction of a long side of a rectangle, or the direction of a long axis of an ellipse) is an example of a "predetermined direction".

The number of layers including the metal wiring part 132 is not limited to three, and may be greater than or less than three. Also, the apertures 135 may not necessarily formed by the layers disposed in the +Z side, and may be formed by the metal wiring part 132 in other layers.

An effective region 136B in FIG. 1B corresponds to the region where light passes through the aperture 135B, and the area of the effective region 136B is referred to as an aperture area SB. An effective region 136G corresponds to the region where light passes through the aperture 135G, and the area of the effective region 136G is referred to as an aperture area SG. Further, an effective region 136R corresponds to the region where light passes through the aperture 135R, and the area of the effective region 136R is referred to as an aperture area SR. The term "area" in the present embodiment indicates an area in a plane (XY plane) parallel to the surface of the photodiode 131.

As the aperture area S of the effective region 136 increases, the amount of light passing through the effective region 136 increases, the light receiving area of the photodiode 131 increases, and the amount of light received by the photodiode 131 increases.

The color filter layer 134 is formed on the +Z side of the interlayer film 133, and has a wavelength selectivity allowing transmission of light in a predetermined wavelength region in incident light.

The color filter layer 134 may be formed by, for example, dispersing a wavelength-selective material such as an organic pigment or an inorganic pigment in an organic material such as acrylic resin, fluoroacrylic resin, polystyrene resin, or polyimide resin. Also, the color filter layer 134 may be formed by dispersing a wavelength-selective material such as an organic pigment or an inorganic pigment in an inorganic material such as a hybrid resin including a silicon group, silicon nitride, or silicon oxide.

Among the color filter layers 134, a color filter layer 134B included in the pixel part 13B has a high transmittance in the wavelength region corresponding to blue light. The color filter layer 134B has a thickness d4 (a length in the Z direction).

A color filter layer 134G included in the pixel part 13G has a high transmittance in the wavelength region corresponding to green light. The color filter layer 134G has a thickness d2. A color filter layer 134R included in the pixel part 13R has a high transmittance in the wavelength region corresponding to red light. The color filter layer 134R has a thickness d3.

A combination of the pixel part 13B including the color filter layer 134B, the pixel part 13G including the color filter layer 134G, and the pixel part 13R including the color filter layer 134R constitutes a pixel array 14 that can express a predetermined color with three primary colors of R, G, and B.

However, the combination of pixels constituting each pixel array 14 is not limited to a combination of pixels arranged in a stripe shape as illustrated in FIG. 1. For example, each pixel array 14 may be constituted by a combination of pixels in a Bayer arrangement that is described later with reference to FIGS. 5A through 5E.

Here, in the present embodiment, the side length a2 of the aperture 135B is longer than the side length a1 of the aperture 135G and the aperture 135R. Accordingly, as illustrated in FIG. 1B, the aperture area SB of the effective region 136B is greater than the aperture area SG of the effective region 136G and the aperture area SR of the effective region 136R.

Figure 2:
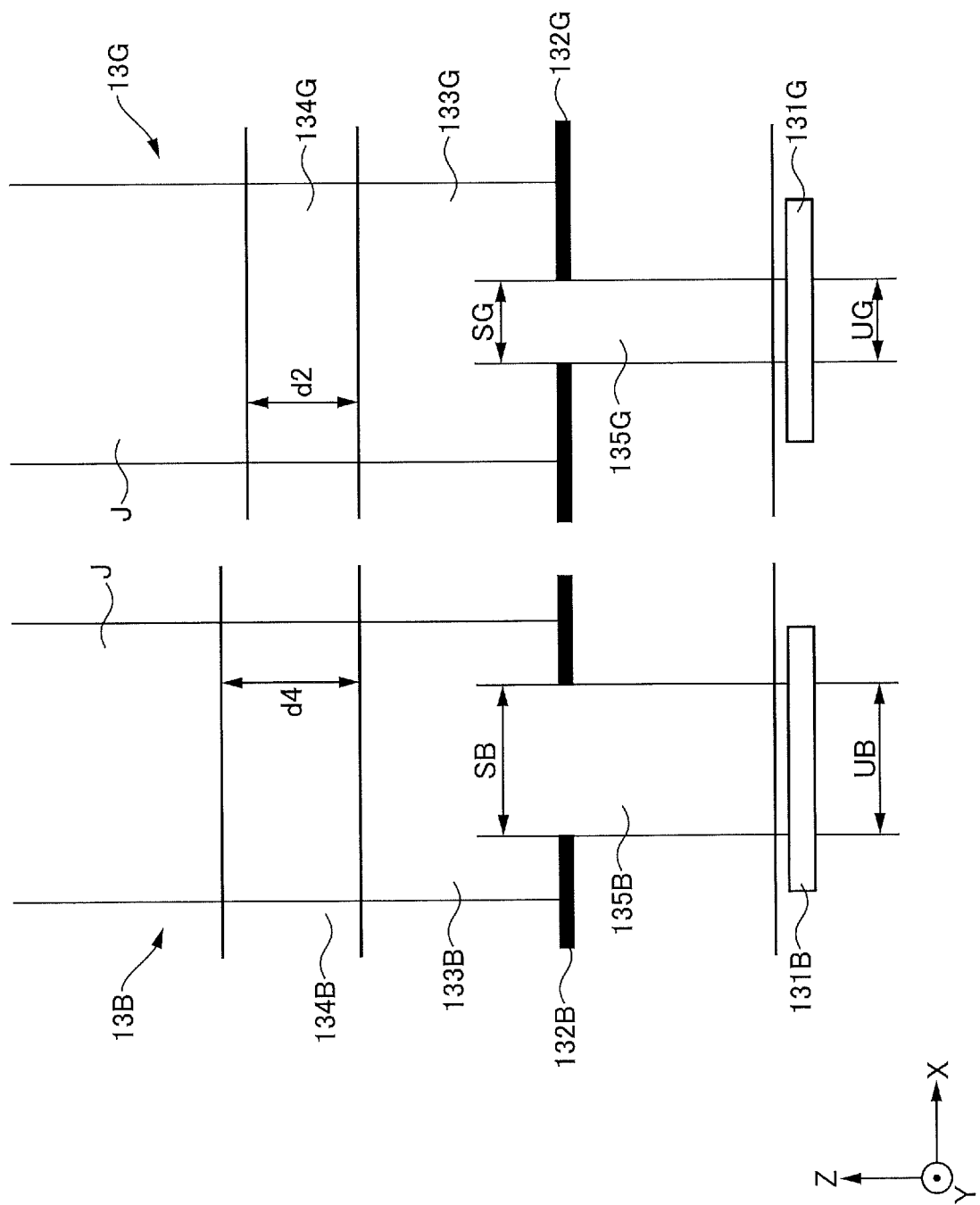
FIG. 2 is a drawing illustrating examples of optical paths from color filter layers to photodiodes.

FIG. 2 is a drawing illustrating examples of optical paths from the color filter layers 134 to the photodiodes 131. FIG. 2 illustrates optical paths of the pixel part 13B and the pixel part 13G in FIG. 1A.

The aperture area SB indicates the area of the effective region 136B of the aperture 135B, and the aperture area SG indicates the area of the effective region 136G of the aperture 135G. A light receiving area UB indicates the light receiving area of the photodiode 131B, and a light receiving area UG indicates the light receiving area of the photodiode 131G.

In FIG. 2, incident light J passes through the color filter layer 134B and the interlayer film 133B, passes through the aperture 135B of the metal wiring part 132B, and then enters the photodiode 131B. Similarly, the incident light J passes through the color filter layer 134G and the interlayer film 133G, passes through the aperture 135G of the metal wiring part 132G, and then enters the photodiode 131G.

Because the aperture area SB is greater than the aperture area SG, the light receiving area UB is greater than the light receiving area UG, and the amount of light received by the photodiode 131B is greater than the amount of light received by the photodiode 131G.

Here, the blue wavelength region is an example of a "first wavelength region", the photodiode 131B is an example of a "first light receiving device", and the aperture 135B is an example of a "first defining part" and a "first aperture". The light receiving area UB is an example of a "first light receiving area".

The green wavelength region is an example of a "second wavelength region", the photodiode 131G is an example of a "second light receiving device", and the aperture 135G is an example of a "second defining part" and a "second aperture". The light receiving area UG is an example of a "second light receiving area".

Also, in the present embodiment, when a maximum transmittance wavelength indicates a wavelength corresponding to the maximum transmittance in a visible light region between 400 nm and 700 nm, the color filter layer 134B has a thickness d4 at which the average transmittance of light in a wavelength region less than or equal to "the maximum transmittance wavelength−100 nm" and a wavelength region greater than or equal to "the maximum transmittance wavelength+100 nm" becomes less than or equal to 5% of the maximum transmittance.

Here, the color filter layer 134B is an example of a "first color filter", and the color filter layer 134G is an example of a "second color filter". In the wavelength region between 410 nm and 490 nm corresponding to the blue wavelength region, a wave length near 450 nm, which corresponds to the maximum transmittance, is an example of a "maximum transmittance wavelength". Also, a wavelength region less than or equal to 350 nm, which is 100 nm shorter than 450 nm, is an example of a "wavelength region less than or equal to 'the maximum transmittance wavelength-100 nm'", and a wavelength region greater than or equal to 550 nm, which is 100 nm longer than 450 nm, is an example of a "wavelength region greater than or equal to 'the maximum transmittance wavelength+100 nm'".

<Transmittance Characteristics of Color Filter Layers 134>

Figure 3A:
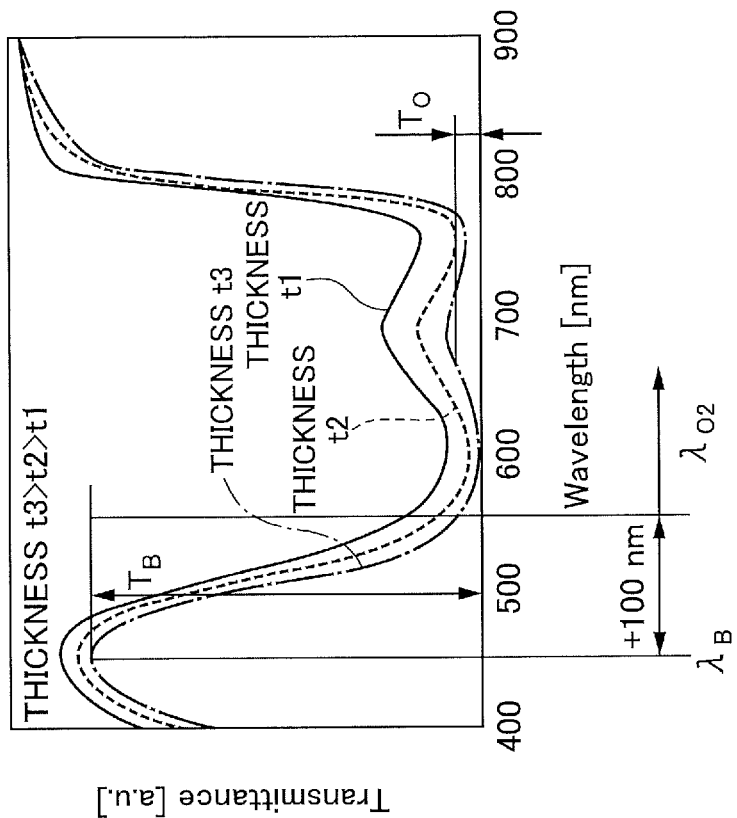
FIG. 3A is a graph indicating transmittance of each of RGB color filter layers.
Figure 3B:
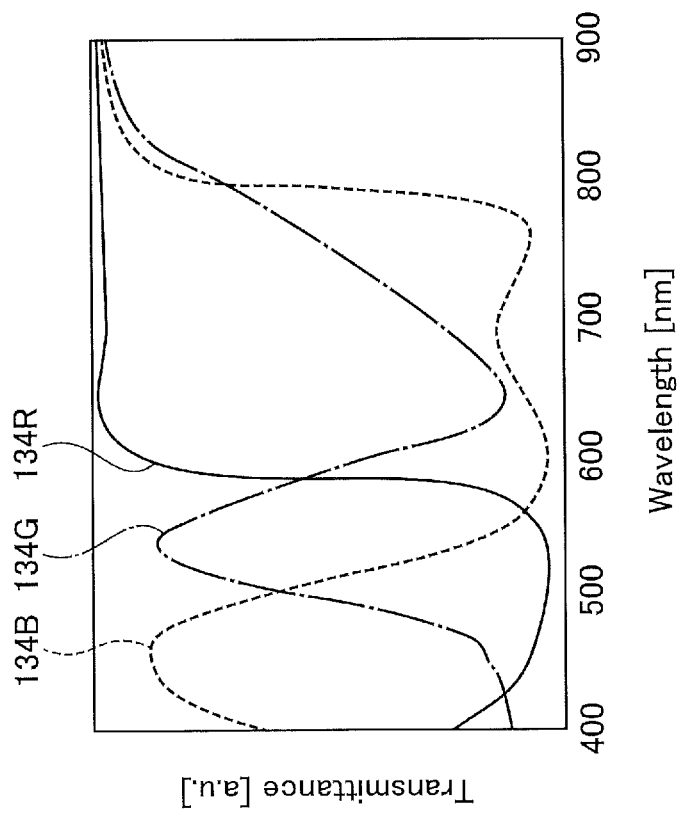
FIG. 3B is a graph indicating changes in transmittance depending on thicknesses of a color filter layer.

Next, to explain the operations of the solid-state image sensor 100, the transmittance characteristics of the color filter layers 134 of the solid-state image sensor 100 are described. FIG. 3A is a graph indicating transmittance of each of the color filter layers 134R, 134G, and 134B. FIG. 3B is a graph indicating changes in the transmittance depending on the thicknesses of the color filter layer 134B.

As illustrated in FIG. 3A, the color filter layer 134B has a high transmittance in a wavelength region between about 410 nm and about 490 nm corresponding to blue light. The color filter layer 134G has a high transmittance in a wavelength region between about 510 nm and about 580 nm corresponding to green light. The color filter layer 134R has a high transmittance in a wavelength region between about 580 nm and about 650 nm corresponding to red light.

Because each color filter layer 134 selectively transmits light in the corresponding visible light wavelength region, the photodiode 131 of the pixel part 13 including the color filter layer 134 can obtain a light detection signal corresponding to the transmittance of the color filter layer 134.

Although detailed explanation is omitted here, in FIG. 3A, each of the color filter layers 134 has a high transmittance in a long wavelength region that is, for example, greater than or equal to 800 nm. If light in the long wavelength region greater than or equal to 800 nm is not necessary, the transmittance of light in the long wavelength region can be reduced greatly by using an infrared ray (IR) cut filter having a low transmittance on the long wavelength side. Therefore, the transmittance in the long wavelength region is ignored here.

Ideally and preferably, the color filter layer 134B has a transmittance of 100% in a wavelength region between 410 nm and 490 nm and a transmittance of 0% in other wavelength regions, the color filter layer 134G has a transmittance of 100% in a wavelength region between 510 nm and 580 nm and a transmittance of 0% in other wavelength regions, and the color filter layer 134R has a transmittance of 100% in a wavelength region between 580 nm and 650 nm and a transmittance of 0% in other wavelength regions.

However, in general, the transmittance of a color filter layer does not become 0% and the color filter layer transmits some amount of light even in wavelength regions other than the corresponding wavelength region. For example, referring to FIG. 3A, the color filter layer 134B has a relatively high transmittance of light in a wavelength region between 650 nm and 750 nm, and the color filter layer 134R has a relatively high transmittance of light in a wavelength region between 400 nm and 550 nm. The light in the wavelength region between 650 nm and 750 nm passing through the color filter layer 134B is undesired light that is not preferable to be received by the photodiode 131B and reduces the blue color reproducibility. Also, the light in the wavelength region between 400 nm and 550 nm passing through the color filter layer 134R is undesired light that is not preferable to be received by the photodiode 131R and reduces the red color reproducibility.

FIG. 3B illustrates the transmittance of the color filter layer 134B in each of cases where the thickness of the color filter layer 134B is t1, t2, and t3 (t3>t2>t1). As the thickness of the color filter layer 134B increases, the overall transmittance of the color filter layer 134B decreases, and the decrease in the transmittance in the wavelength region of undesired light (650 nm to 750 nm) is greater than the decrease in the transmittance in the wavelength region with a high transmittance (410 nm to 490 nm).

Accordingly, when a maximum transmittance wavelength indicates a wavelength corresponding to the maximum transmittance in a visible light region between 400 nm and 700 nm, the transmittance of undesired light can be greatly reduced compared with the light in the blue wavelength region by forming the color filter layer 134B to have a thickness at which the average transmittance in a wavelength region less than or equal to "the maximum transmittance wavelength-100 nm" and a wavelength region greater than or equal to "the maximum transmittance wavelength+100 nm" becomes less than or equal to 5% of the maximum transmittance.

For example, in the case of the thickness t3 in FIG. 3B, when a wavelength $\lambda_B$ corresponds to a maximum transmittance $T_B$, a wavelength region $\lambda_{O1}$ (not shown) indicates a wavelength region less than or equal to "the wavelength $\lambda_B$-100 nm", and a wavelength region $\lambda_{O2}$ indicates a wavelength greater than or equal to "the wavelength $\lambda_B$+100 nm". An average transmittance $T_O$ in the wavelength regions $\lambda_{O1}$ and $\lambda_{O2}$ is less than or equal to 5% of the maximum transmittance $T_B$.

However, the range of the average transmittance $T_O$ is not limited to less than or equal to 5% and may be set at a lower range. For example, the average transmittance $T_O$ may be less than or equal to 1% of the maximum transmittance $T_B$. In this case, when a light detection signal of the solid-state image sensor 100 is processed as 8-bit data, the light detection signal of light in an undesired wavelength region can be reduced to a level of about two least significant bits (LSB) in 256 gradations. Considering that a noise component generally corresponds to several LSBs, two LSBs correspond to a level buried in noise. Therefore, the light detection signal of light in the undesired wavelength region is buried in noise and does not affect the color reproducibility at all.

Also, when the average transmittance $T_O$ is less than or equal to 0.25% of the maximum transmittance $T_B$, the light detection signal of light in the undesired wavelength region is buried in the noise and does not affect the color reproducibility at all even if the light detection signal of the solid-state image sensor 100 is processed as 10-bit data where a noise component corresponds to a smaller number of LSBs than in 8-bit data.

In contrast, when the color filter layer 134B has a greater thickness, the amount of light in the blue wavelength region also decreases. As a result, the amount of light received by the pixel part 13B corresponding to blue color becomes unbalanced with respect to the amount of light received by the pixel part 13G corresponding to green color and the amount of light received by the pixel part 13R corresponding to red color, and the color reproducibility may be reduced.

For the above reasons, in the present embodiment, the aperture area SB of the effective region 136B is made larger than the aperture areas SG and SR so that the amount of light that passes through the color filter layer 134B and reaches the photodiode 131B becomes greater than the amounts of light that passes through the color filter layers 134G and 134R and reaches the photodiodes 131G and 131R.

This configuration makes it possible to compensate for the decrease in the amount of light in the blue wavelength region due to the increase in the thickness of the color filter layer 134B, and makes it possible to prevent the reduction in color reproducibility resulting from the decrease in the amount of light in the blue wavelength region.

<Effects of Solid-State Image Sensor 100>

Figure 4A:
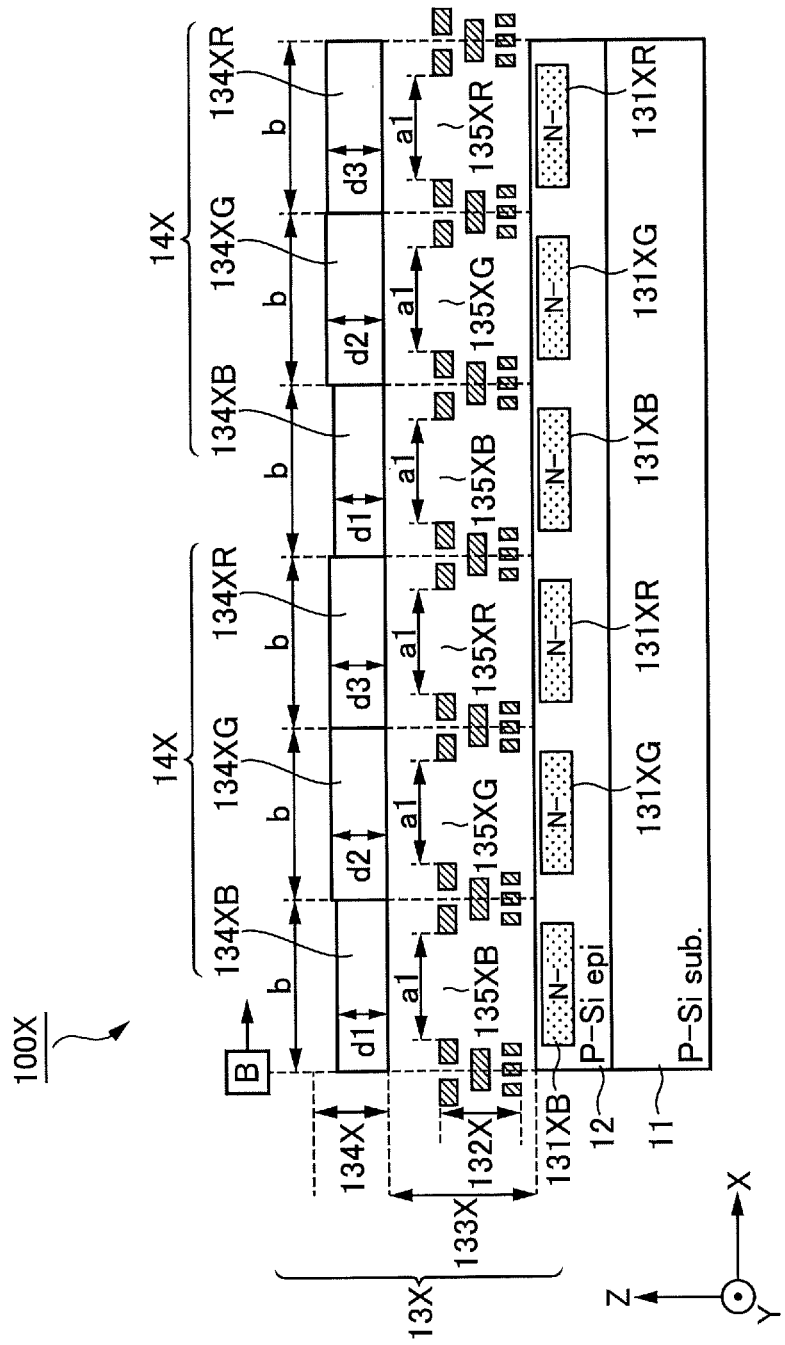
FIG. 4A is a cross-sectional view of a solid-state image sensor according to a first comparative example.

Next, effects of the solid-state image sensor 100 are described. Before describing the effects of the solid-state image sensor 100, a configuration of a solid-state image sensor 100X according to a first comparative example is described. FIG. 4A is a cross-sectional view of the solid-state image sensor 100X according to the first comparative example, and FIG. 4B is a plan view of the solid-state image sensor 100X at a position B in FIG. 4A.

Figure 4B:
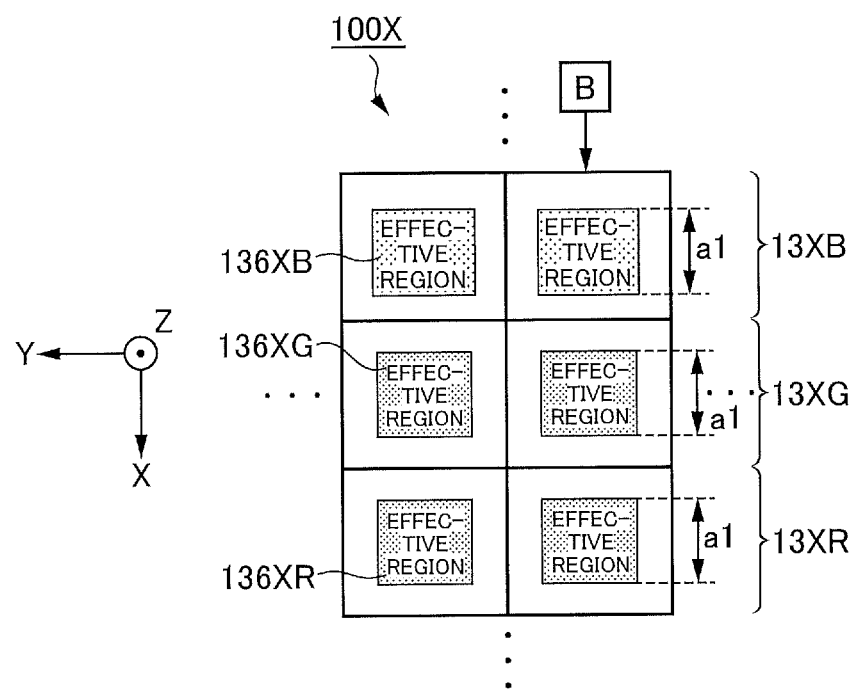
FIG. 4B is a plan view of the solid-state image sensor at a position B in FIG. 4A.

In FIGS. 4A and 4B, the same reference numbers as those in FIG. 1 are assigned to components having the same functions as those of the components in the solid-state image sensor 100, and reference numbers obtained by adding a suffix "X" to the reference numbers in FIG. 1 are assigned to components having functions different from those of the components in the solid-state image sensor 100. Below, components different from the solid-state image sensor 100 are mainly described.

As illustrated in FIG. 4A, in the solid-state image sensor 100X, a thickness d1 of a color filter layer 134XB is less than a thickness d2 of a color filter layer 134XG and a thickness d3 of a color filter layer 134XR. Each of an aperture 135XB, an aperture 135XG, and an aperture 135XR formed by a metal wiring part 132X is a square aperture with a side length a1.

In the configuration of the solid-state image sensor 100X, the side lengths of the apertures 135XB, 135XG, and 135XR are the same, and therefore the aperture areas SXB, SXG, and SXR of the effective regions 136XB, 136XG, and 136XR are the same.

Also, because the thickness d1 of the color filter layer 134XB is less than the thicknesses d2 and d3, the amount of undesired light passing through the color filter layer 134XB and reaching the photodiode 131XB increases. The undesired light is, for example, in a wavelength region between 650 nm and 750 nm other than the blue wavelength region. As a result, the light detection signal of light in the blue wavelength region and the light detection signal of undesired light other than blue light may be mixed, and the color reproducibility of blue may be reduced.

On the other hand, in the present embodiment, when the wavelength $\lambda_B$ corresponds to the maximum transmittance $T_B$, the color filter layer 134B is formed with the thickness d4 at which the average transmittance $T_O$ in the wavelength region less than or equal to "the wavelength $\lambda_B$−100 nm" and the wavelength region greater than or equal to "the wavelength $\lambda_B$+100 nm" becomes less than or equal to 5% of the maximum transmittance $T_B$.

This configuration makes it possible to make the amount of undesired light, which is in wavelength regions other than the blue wavelength region, passing through the color filter layer 134B sufficiently smaller than the amount of light in the blue wavelength region. Also, making the aperture area SB of the effective region 136B greater than the aperture area SG of the effective region 136G and the aperture area SR of the effective region 136R makes it possible to compensate for the decrease in the amount of light in the blue wavelength region caused by increasing the thickness d4 of the color filter layer 134B.

This in turn enables the photodiode 131B to receive a desired amount of light in the blue wavelength region and makes it possible to improve the blue color reproducibility of the solid-state image sensor 100.

The present embodiment is described above using the pixel part 13B corresponding to the blue wavelength region as an example. However, the above descriptions may also be applied to other colors to achieve similar effects.

For example, in the case of the pixel part 13G for green color, when 545 nm corresponds to a maximum transmittance T G, the color filter layer 134G is formed with a thickness d2 at which an average transmittance $T_O$ in a wavelength region less than or equal to 445 nm=545 nm−100 nm and a wavelength region greater than or equal to 645 nm=545 nm+100 nm becomes less than or equal to 5% of the maximum transmittance $T_G$.

Also, the decrease in the amount of light in the green wavelength region as a result of increasing the thickness d2 of the color filter layer 134G is compensated for by making the aperture area SG of the effective region 136G greater than the aperture area SB of the effective region 136B and the aperture area SR of the effective region 136R.

This in turn enables the photodiode 131G to receive a desired amount of light in the green wavelength region and makes it possible to improve the green color reproducibility of the solid-state image sensor 100.

In the above example of the present embodiment, the effective region 136 is enlarged two-dimensionally. However, the same effect can be achieved by enlarging the effective region 136 only in a one-dimensional direction.

<Arrangements of Pixel Array>

Next, arrangements of the pixel parts 13 in the pixel array 14 are described.

FIGS. 5A through 5E are drawings illustrating examples of arrangements of the pixel parts 13 in the pixel array 14. FIG. 5A illustrates an arrangement of the pixel parts 13 in the entire solid-state image sensor 100. FIG. 5B is an enlarged view of an example of an RGB 3-color stripe arrangement, FIG. 5C is an enlarged view of an example of an RGB 4-color stripe arrangement, FIG. 5C is an enlarged view of an example of an RGB 3-color Bayer arrangement, and FIG. 5E is an enlarged view of an example of an RGB 4-color Bayer arrangement. The term "RGB 4 color" indicates four colors including near-infrared light (IR) in addition to three primary colors of R, G, and B.

The examples of arrangements illustrated in FIGS. 5B through 5E are based on a pixel region 150a extracted from FIG. 5A. In FIGS. 5B through 5E, BCF indicates a blue pixel, GCF indicates a green pixel, and RCF indicates a red pixel.

In FIG. 5B, one pixel array 14b is constituted by a stripe arrangement of three pixels including the blue pixel BCF, the green pixel GCF, and the red pixel RCF arranged in the Y-direction. The pixel array 14b represents RGB colors.

In FIG. 5C, one pixel array 14c is constituted by a stripe arrangement of four pixels including the blue pixel BCF, the green pixel GCF, the red pixel RCF, and a near-infrared pixel IR that are arranged in the Y-direction. The near-infrared pixel IR has a configuration similar to the blue pixel BCF, the green pixel GCF, and the red pixel RCF except that a visible light cut filter is provided instead of the color filter layer to remove visible light and allow near-infrared light to enter the photodiode. The pixel array 14c represents RGB colors and the intensity of near-infrared light.

In FIG. 5D, one pixel array 14d is constituted by a four-pixel Bayer arrangement where two pixels are arranged in the X-direction and two pixels are arranged in the Y-direction. In the pixel array 14d, a +Y side row includes the blue pixel BCF and the green pixel GCF arranged in the X-direction, and a −Y side row includes the green pixel GCF and the red pixel RCF arranged in the X-direction.

In FIG. 5E, one pixel array 14e is constituted by a four-pixel Bayer arrangement where two pixels are arranged in the X-direction and two pixels are arranged in the Y-direction. In the pixel array 14e, a +Y side row includes the blue pixel BCF and the near-infrared pixel IR arranged in the X-direction, and a −Y side row includes the green pixel GCF and the red pixel RCF arranged in the X-direction.

Applying the above embodiment to the Bayer arrangements illustrated in FIGS. 5D and 5E makes it possible to suppress the sensitivity to light in an undesired wavelength region in a solid-state image sensor for color imaging in the visible light region.

Also, applying the above embodiment to the arrays illustrated in FIGS. 5C and 5D additionally including the near-infrared pixel IR makes it possible to suppress the sensitivity to light in an undesired wavelength region in a solid-state image sensor designed to obtain imaging information in the near-infrared region in addition to color imaging information in the visible light region.

Here, the visible light cut filter included in the near-infrared pixel IR corresponds to a "first color filter" when improving the color reproducibility of the near-infrared light and corresponds to a "second color filter" when improving the color reproducibility in the visible light wavelength region.

Second Embodiment

Next, a solid-state image sensor 100a according to a second embodiment is described.

In the second embodiment, the solid-state image sensor 100a includes a first optical system that guides light in a first wavelength region to a first light receiving device and a second optical system that guides light in a second wavelength region to a second light receiving device. The lens diameter of the first optical system is made greater than the lens diameter of the second optical system so that the light receiving area on the first light receiving device for receiving the light in the first wavelength region becomes greater than the light receiving area on the second light receiving device for receiving the light in the second wavelength region. This configuration makes it possible to compensate for a change in the amount of light in the first wavelength region as a result of adjusting the thickness of the first filter and thereby makes it possible to improve the color reproducibility of the solid-state image sensor.

<Configuration of Solid-State Image Sensor 100a>

Figure 6A:
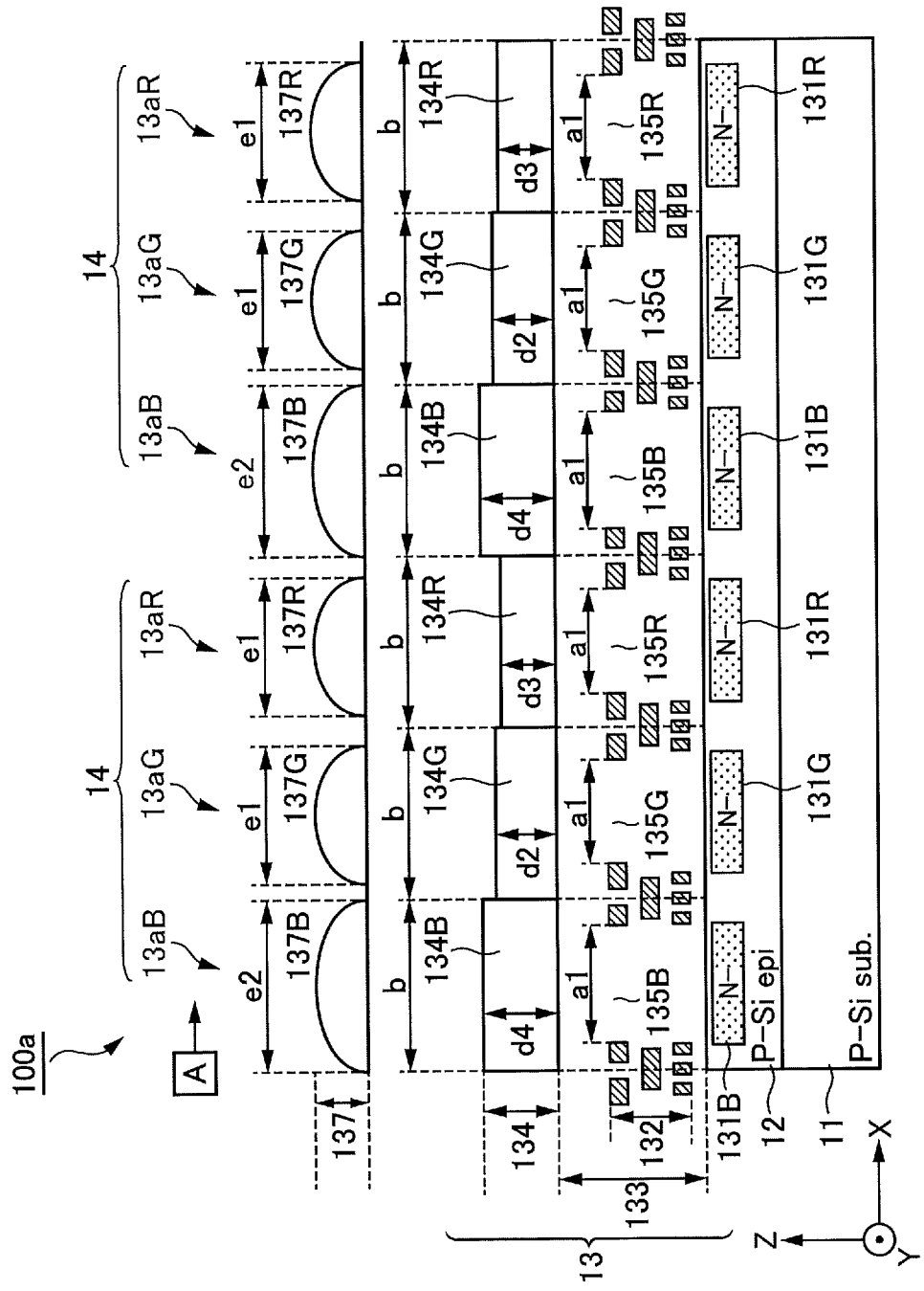
FIG. 6A is a cross-sectional view of a solid-state image sensor according to a second embodiment.
Figure 6B:
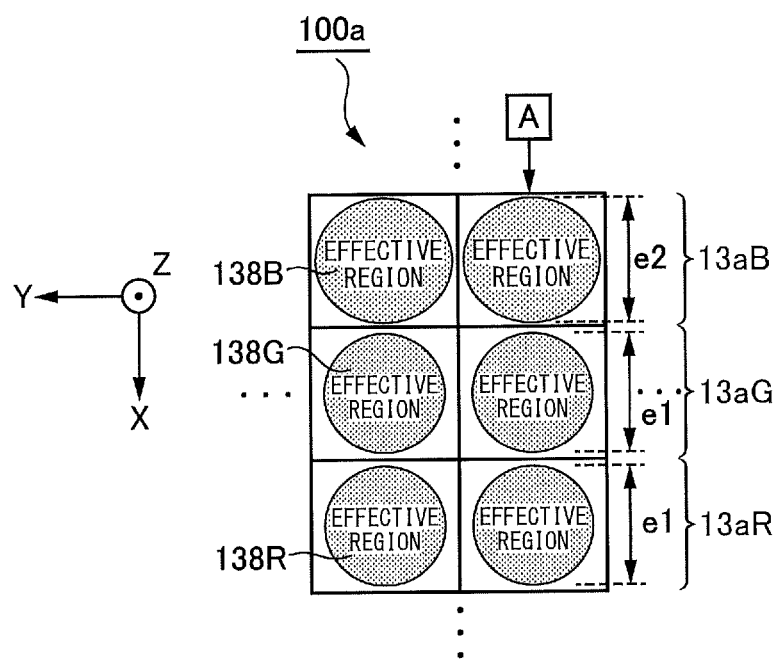
FIG. 6B is a plan view of the solid-state image sensor at a position A in FIG. 6A.

FIG. 6A is a cross-sectional view of the solid-state image sensor 100a, and FIG. 6B is a plan view of the solid-state image sensor 100a at a position A in FIG. 6A.

As illustrated in FIG. 6, the solid-state image sensor 100a includes pixel parts 13a each of which includes a microlens 137. The microlens 137 is a plano-convex lens with a circular outer shape and a spherical convex surface on the +Z side. The microlens 137 is positioned such that incident light on the pixel part 13a is focused on the photodiode 131. However, the shape of the microlens 137 is not limited to this example. For example, the microlens 137 may have a different outer shape such as a rectangular outer shape and may also have an aspherical shape.

The microlens 137 is stacked on the +Z side of the color filter layer 134 corresponding to the color of the pixel part 13a. A pixel part 13aB includes a microlens 137B, a pixel part 13aG includes a microlens 137G, and a pixel part 13aR includes a microlens 137R.

The microlens 137B has a diameter e2 that is greater than a diameter e1 of the microlenses 137G and 137R. Because the diameter e2 is greater than the diameter e1, a pupil area VB of the effective region 138B of the microlens 137B is greater than a pupil area VG of the effective region 138G of the microlens 137G and a pupil area VR of the effective region 138R of the microlens 137R.

The focal lengths of the microlens 137B, the microlens 137G, and the microlens 137R are the same. For this reason and because the diameter e2 is greater than the diameter e1, the numerical aperture of the microlens 137B is greater than the numerical aperture of the microlens 137G and the numerical aperture of the microlens 137R. Here, the numerical aperture (NA) is an index indicating the brightness of an optical system such as a lens. As the numerical aperture increases, the amount of light passing through the optical system increases, the light receiving area on the light-receiving device increases, and the amount of light receivable by the light-receiving device increases.

Here, with the microlens 137, the incident light on the pixel part 13a is guided such that the incident light is focused on the photodiode 131. Accordingly, the cross-sectional area of the beam of the incident light at a position corresponding to the aperture 135 formed by the metal wiring part 132 is smaller than the aperture area S of the aperture 135.

Thus, the aperture 135 does not directly define the effective region through which the incident light passes and does not have a function to define the amount of light received by the photodiode 131. In the present embodiment, instead of the aperture area S of the aperture 135, the numerical aperture of the microlens 137 has the function to define the amount of light. Because the amount of light that reaches the photodiode 131 increases as the diameter of the microlens 137 increases, the amount of light received by the photodiode 131B is greater than the amount of light received by each of the photodiodes 131G and 131R.

This configuration makes it possible to compensate for a decrease in the amount of light in the blue wavelength region caused as a result of forming the color filter layer 134B with the thickness d4 at which the average transmittance $T_O$ in the wavelength region less than or equal to "the wavelength corresponds to the maximum transmittance $T_B$−100 nm" and the wavelength region greater than or equal to "the wavelength corresponds to the maximum transmittance $T_B$+100 nm" becomes less than or equal to 5% of the maximum transmittance $T_B$.

FIG. 7 is a drawing illustrating examples of optical paths from the microlenses 137 to the photodiodes 131. FIG. 7 illustrates optical paths of the pixel part 13aB and the pixel part 13aG in FIG. 6A.

In FIG. 7, incident light J is converged and guided to the photodiode 131B by the microlens 137B. Similarly, incident light J is converged and guided to the photodiode 131G by the microlens 137G.

At the position of the aperture 135 of the metal wiring part 132, the diameter of the beam of the incident light J is smaller than the side length a1 of the rectangular aperture 135. Therefore, the aperture area S of the aperture 135 does not directly define the amount of light of the incident light J. As the diameter of the microlens 137B increases, the microlens 137B can more efficiently focus and guide the incident light J onto the photodiode 131B and the amount of light entering the photodiode 131B increases. Also, the numerical aperture can be increased and the amount of light entering the photodiode 131B can be increased by making a focal length f of the microlens 137B shorter than the focal length of the microlens 137G.

Here, the microlens 137B is an example of each of a "first optical system" and a "first lens", and the microlens 137G is an example of each of a "second optical system" and a "second lens".

<Effects of Solid-State Image Sensor 100a>

Figure 8A:
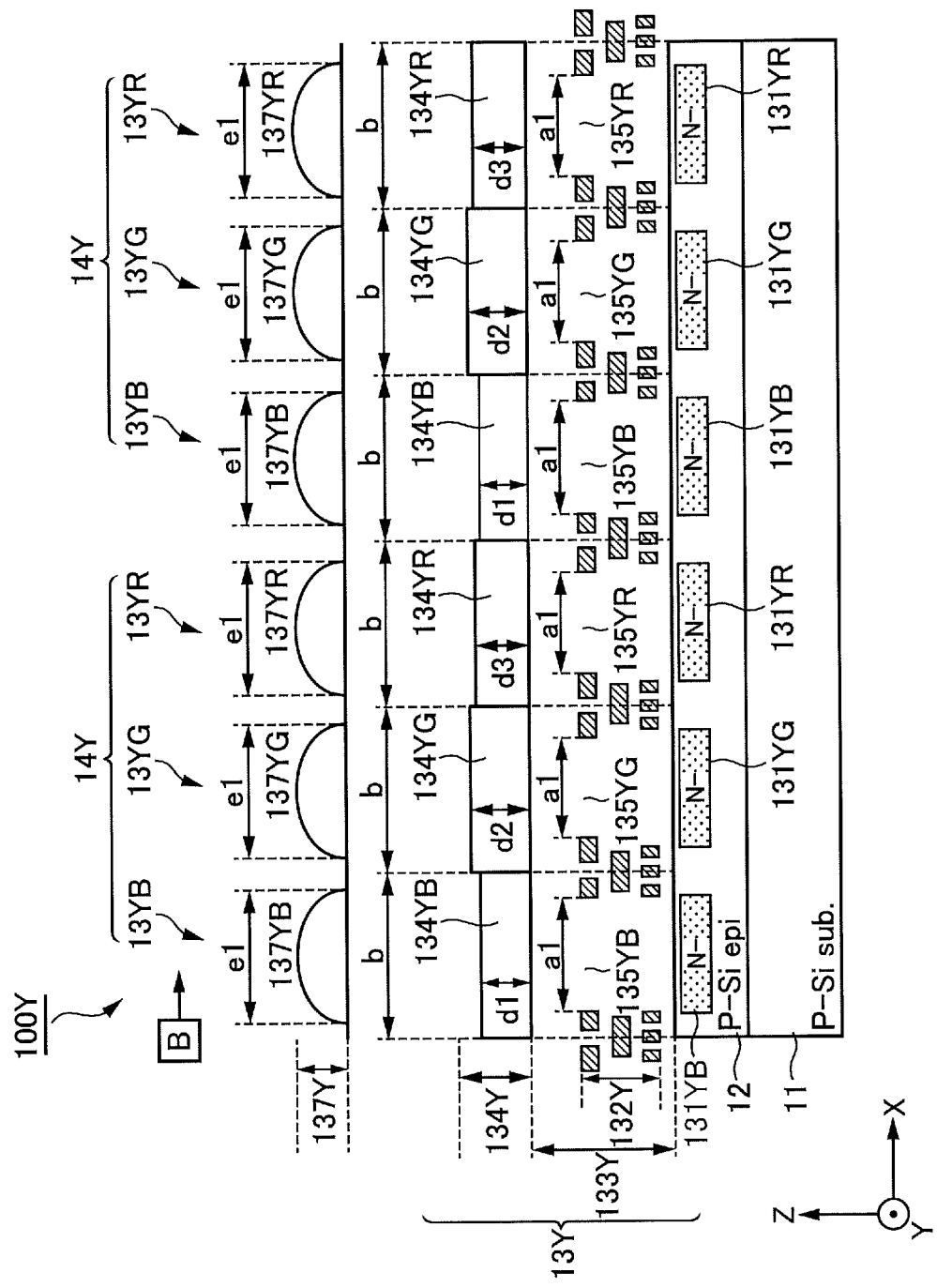
FIG. 8A is a cross-sectional view of a solid-state image sensor according to a second comparative example.
Figure 8B:
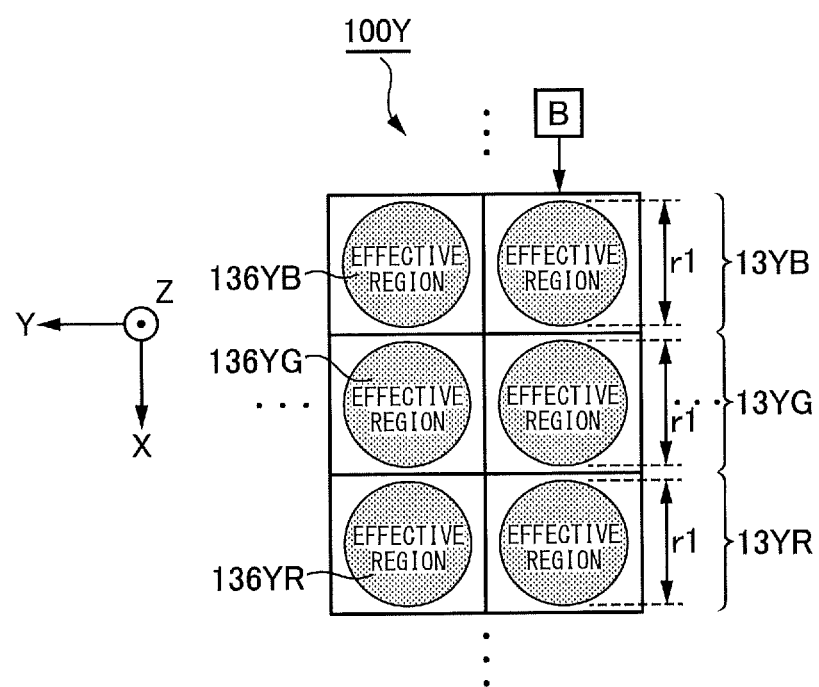
FIG. 8B is a plan view of the solid-state image sensor at a position B in FIG. 8A.

Next, effects of the solid-state image sensor 100a are described. Before describing the effects of the solid-state image sensor 100a, a configuration of a solid-state image sensor 100Y according to a second comparative example is described. FIG. 8A is a cross-sectional view of the solid-state image sensor 100Y according to the second comparative example, and FIG. 8B is a plan view of the solid-state image sensor 100Y at a position B in FIG. 8A.

As illustrated in FIG. 8A, in the solid-state image sensor 100Y, a thickness d1 of a color filter layer 134YB is less than a thickness d2 of a color filter layer 134YG and a thickness d3 of a color filter layer 134YR. Also, because the microlenses 137YB, 137YG, and 137YR have the same diameter e1 and the same focal length, their numerical apertures are also the same.

With the configuration of the solid-state image sensor 100Y, because the numerical apertures of the microlenses 137YB, 137YG, and 137YR are the same, a light receiving area UYB on the photodiode 131YB, a light receiving area UYG on the photodiode 131YG, and a light receiving area UYR on the photodiode 131YR are also the same.

Also, because the thickness d1 of the color filter layer 134YB is less than the thicknesses d2 and d3, the amount of undesired light passing through the color filter layer 134YB and reaching the photodiode 131YB increases. The undesired light is, for example, in a wavelength region between 650 nm and 750 nm other than the blue wavelength region. As a result, the light detection signal of light in the blue wavelength region and the light detection signal of undesired light other than blue light may be mixed, and the color reproducibility of blue may be reduced.

On the other hand, in the present embodiment, the solid-state image sensor 100a includes the microlens 137B that guides light in the blue wavelength region to the photodiode 131B and the microlens 137G that guides light in the green wavelength region to the photodiode 131G. The numerical aperture of the microlens 137B is made greater than the numerical aperture of the microlens 137G so that the light receiving area UB of the light in the blue wavelength region on the photodiode 131B becomes greater than the light receiving area UG of the light in the green wavelength region on the photodiode 131G. This configuration makes it possible to compensate for a change in the amount of light in the blue wavelength region caused as a result of adjusting the thickness of the color filter layer 134B, and thereby makes it possible to improve the color reproducibility of the solid-state image sensor.

Other effects are the same as those described in the first embodiment.

In the example described above, the diameter e2 of the microlens 137B is made greater than the diameter e1 of each of the microlenses 137G and 137R to compensate for a decrease in the amount of light received by the photodiode 131B. However, the present invention is not limited to this example. As another example, the decrease in the amount of light may be compensated for by increasing the diameter e2 of the microlens 137B and by designing the radius of curvature or the aspherical shape of at least one surface of the microlens 137B.

Also, although a front-illuminated structure is described with reference to FIG. 6, a back-illuminated structure may instead be used.

Further, although a refractive microlens is used in the present embodiment, a transmissive diffractive optical element (DOE) may also be used.

Third Embodiment

Next, an image scanning device 200 according to a third embodiment is described. Here, the image scanning device 200 is a device such as a scanner for capturing an object image.

Figure 9:
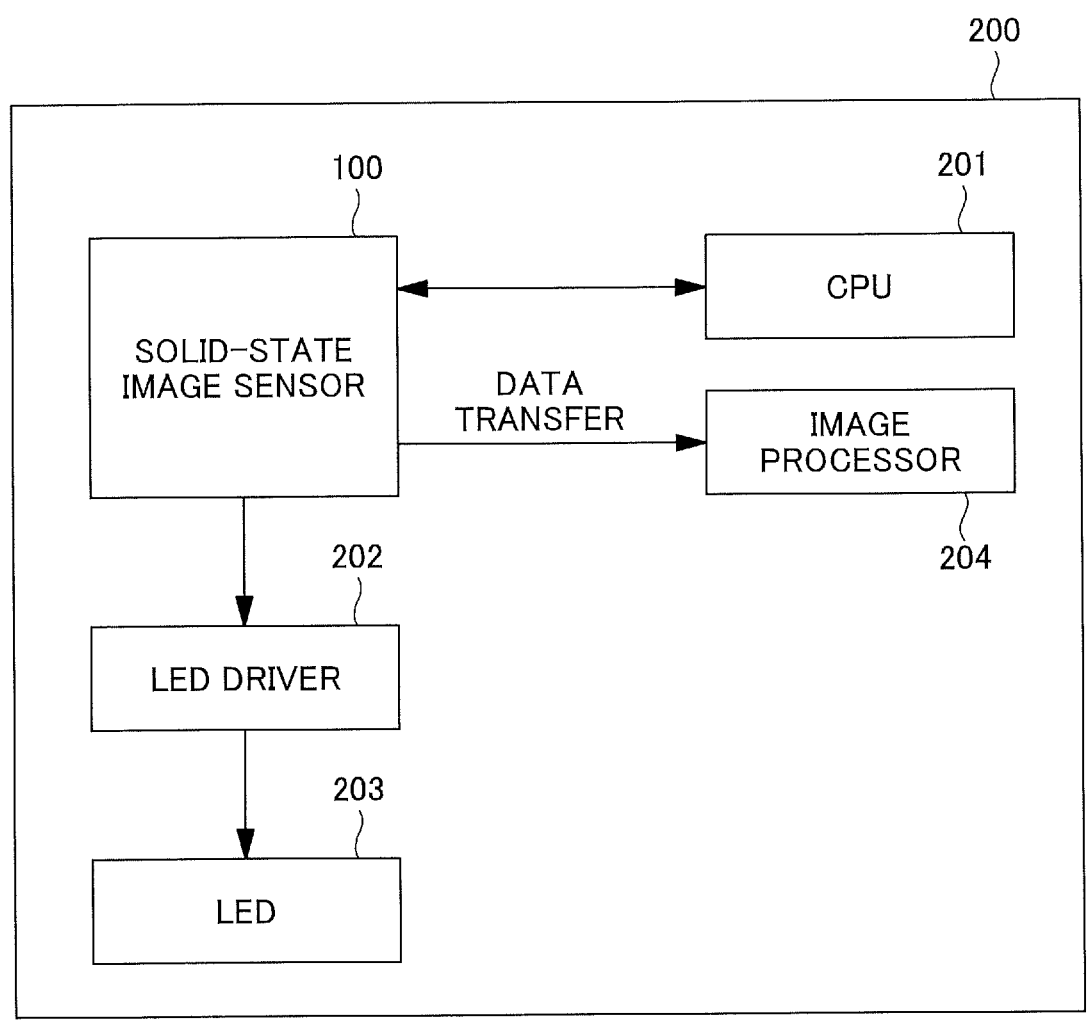
FIG. 9 is a block diagram illustrating an example of a configuration of an image scanning device according to a third embodiment.

FIG. 9 is a block diagram illustrating an example of a configuration of the image scanning device 200. As illustrated in FIG. 9, the image scanning device 200 includes the solid-state image sensor 100, a central processing unit (CPU) 201, a light emitting diode (LED) driver 202, a light emitting diode (LED) 203, and an image processor 204.

The solid-state image sensor 100 receives light emitted by the LED 203 and then reflected from an object (e.g., a document), and transfers a signal corresponding to the received light to the image processor 204 as scanned image data of the object.

The CPU 201 is a processor that controls the entire image scanning device 200. The LED driver 202 is an electric circuit that drives the LED 203 under the control of the CPU 201 to irradiate an object such as a document.

The image processor 204 is an electronic circuit that performs various correction processes on image data transferred from the solid-state image sensor 100.

In the present embodiment, the image scanning device 200 including the solid-state image sensor 100 can capture an image with high color reproducibility.

Fourth Embodiment

Next, an image forming apparatus 300 according to a fourth embodiment is described. Here, the image forming apparatus 300 is an apparatus such as a multifunction peripheral (MFP) or a printer that forms an image on a recording medium such as paper.

Figure 10:
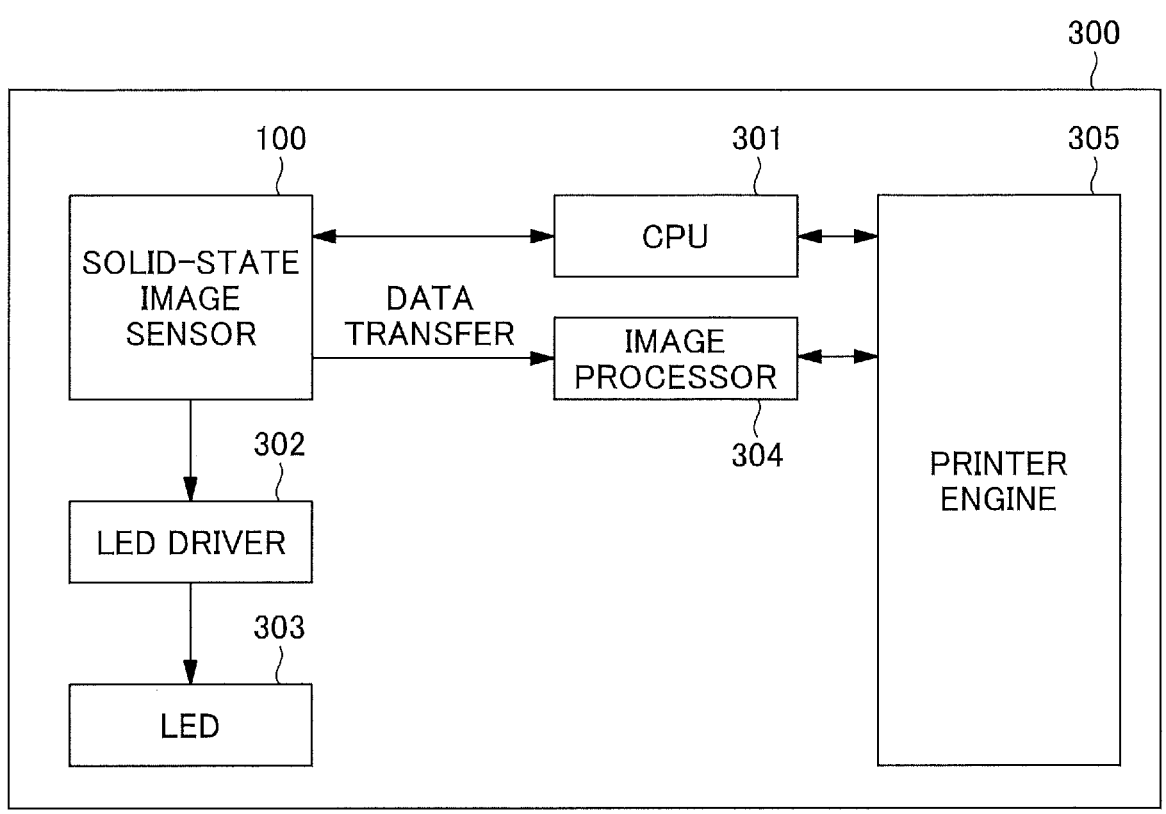
FIG. 10 is a block diagram illustrating an example of a configuration of an image forming apparatus according to a 4th embodiment.

FIG. 10 is a block diagram illustrating an example of a configuration of the image forming apparatus 300. As illustrated in FIG. 10, the image forming apparatus 300 includes the solid-state image sensor 100, a CPU 301, an LED driver 302, an LED 303, an image processor 304, and a printer engine 305.

The solid-state image sensor 100 receives light emitted by the LED 303 and then reflected from an object (e.g., a document) and transfers a signal corresponding to the received light to the image processor 304 as scanned image data of the object.

The CPU 301 is a processor that controls the entire image forming apparatus 300. The LED driver 302 is an electric circuit that drives the LED 303 under the control of the CPU 301 to irradiate an object such as a document.

The image processor 304 is an electronic circuit that performs various correction processes on image data transferred from the solid-state image sensor 100.

The printer engine 305 receives the image data captured by the solid-state image sensor 100 via the image processor 304. Then, the printer engine 305 forms an image on a recording medium based on the image data under the control of the CPU 301.

In the present embodiment, the image forming apparatus 300 including the solid-state image sensor 100 can form an image with high color reproducibility on a recording medium.

A solid-state image sensor, an image scanning device, and an image forming apparatus according to the embodiments of the present invention are described above. However, the present invention is not limited to the specifically disclosed embodiments, and variations and modifications may be made without departing from the scope of the present invention.

Each of the blue wavelength region, the green wavelength region, the red wavelength region, and the near-infrared wavelength region is an example of a "predetermined wavelength region". Each of the color filter layer 134B, the color filter layer 134G, the color filter layer 134R, and the visible light cut filter is an example of a "color filter". Each of the photodiode 131B, the photodiode 131G, the photodiode 131R, and the photodiode included in the near-infrared pixel IR is an example of a "light-receiving device". Each of the aperture 135B, the aperture 135G, the aperture 135R, and the aperture in the near-infrared pixel IR is an example of a "light amount compensator". Each of the microlens 137B, the microlens 137G, the microlens 137R, and the microlens in the near-infrared pixel IR is an example of a "light amount compensator".

In the embodiments, the aperture area of an aperture and the diameter of a microlens are defined as examples of light amount compensators. However, the present invention is not limited to these examples. As long as the amount of light in a predetermined wavelength region can be compensated for, a light amount compensator may also be implemented by defining the average transmittance of a color filter by changing the filling rate of a pigment contained in the color filter, or by using a neutral density (ND) filter for adjusting the amount of light.

In the above examples, the solid-state image sensor of the embodiment is applied to an image scanning device and an image forming apparatus. However, the present invention is not limited to these examples, and the solid-state image sensor of the embodiment may also be applied to an imaging device such as a camera.

What is claimed is:

1. A solid-state image sensor, comprising:
   a first color filter and a second color filter having different thicknesses and configured to transmit light in predetermined wavelength region's;

a first optical system having a first lens and a second optical system having a second lens, the first lens and the second lens having different diameters and configured to guide the light for the first color filter and the second color filter;

light-receiving devices configured to receive the light in the predetermined wavelength regions passing through the first color filter and the second color filter; and a light amount compensator configured to compensate for an amount of the light passing through the first color filter or the second color filter based on the different thicknesses corresponding to the first color filter and the second color filter, and the different diameters corresponding to the first lens and the second lens, wherein a light receiving area of each light-receiving device is defined by a diameter of the light passing through a corresponding color filter and has an identical size of an aperture of a corresponding light-receiving device, the aperture being configured to allow the light to pass therethrough toward the corresponding light-receiving device.

2. The solid-state image sensor as claimed in claim 1, wherein when maximum transmittance wavelength indicates a wavelength corresponding to a maximum transmittance in a visible light region between 400 nm and 700 nm, the first color filter has a thickness at which an average transmittance of light in a wavelength region less than or equal to "the maximum transmittance wavelength−100 nm" and a wavelength region greater than or equal to "the maximum transmittance wavelength+100 nm" becomes less than or equal to 5% of the maximum transmittance.

3. The solid-state image sensor as claimed in claim 1, wherein
the first color filter transmits light in a first wavelength region;
the second color filter transmits light in a second wavelength region;
the light-receiving devices include a first light receiving device that receives the light in the first wavelength region passing through the first color filter and a second light receiving device that receives the light in the second wavelength region passing through the second color filter;
the solid-state image sensor further comprises
a first defining part that defines a first light receiving area of the light in the first wavelength region on the first light receiving device, and
a second defining part that defines a second light receiving area of the light in the second wavelength region on the second light receiving device;
the first light receiving area is greater than the second light receiving area; and
when a maximum transmittance wavelength indicates a wavelength corresponding to a maximum transmittance in a visible light region between 400 nm and 700 nm, the first color filter has a thickness at which an average transmittance of light in a wavelength region less than or equal to "the maximum transmittance wavelength−100 nm" and a wavelength region greater than or equal to "the maximum transmittance wavelength+100 nm" becomes less than or equal to 5% of the maximum transmittance.

4. The solid-state image sensor as claimed in claim 3, wherein
the first defining part includes a first aperture that allows the light in the first wavelength region to pass therethrough toward the first light receiving device;
the second defining part includes a second aperture that allows the light in the second wavelength region to pass therethrough toward the second light receiving device; and
an aperture area of the first aperture is greater than an apefuse area of the second aperture.

5. The solid-state image sensor as claimed in claim 4, wherein a length of the first aperture in a predetermined direction is longer than a length of the second aperture in the predetermined direction.

6. The solid-state image sensor as claimed in claim 1, wherein one of the first color filter and the second color filter is a visible light cut filter that removes visible light.

7. The solid-state image sensor as claimed in claim 3, wherein
the first defining part includes the first optical system that guides the light in the first wavelength region to the first light receiving device;
the second defining part includes the second optical system that guides the light in the second wavelength region to the second light receiving device; and
the diameter of the first lens included in the first optical system is greater than the diameter of the second lens included in the second optical system.

8. An image scanning device, comprising:
the solid-state image sensor as claimed in claim 1.

9. An image forming apparatus, comprising:
the solid-state image sensor as claimed in claim 1.

* * * * *